(12) United States Patent
Greiss et al.

(10) Patent No.: US 11,038,726 B2
(45) Date of Patent: Jun. 15, 2021

(54) 8B10B PAM4 ENCODING

(71) Applicant: Valens Semiconductor Ltd., Hod Hasharon (IL)

(72) Inventors: Israel Greiss, Raanana (IL); Eyran Lida, Kfar Ha-Oranim (IL)

(73) Assignee: Valens Semiconductor Ltd., Hod Hasharon (IL)

( * ) Notice: Subject to any disclaimer, the term of this patent is extended or adjusted under 35 U.S.C. 154(b) by 0 days.

(21) Appl. No.: 16/928,355

(22) Filed: Jul. 14, 2020

(65) Prior Publication Data

US 2021/0014091 A1    Jan. 14, 2021

Related U.S. Application Data

(60) Provisional application No. 62/873,965, filed on Jul. 14, 2019.

(51) Int. Cl.
*H04L 25/49* (2006.01)
*H03M 5/20* (2006.01)
*H04L 27/04* (2006.01)

(52) U.S. Cl.
CPC .......... *H04L 25/4917* (2013.01); *H03M 5/20* (2013.01); *H04L 27/04* (2013.01)

(58) Field of Classification Search
CPC . H04L 25/4908; H04L 25/4917; H04L 27/04; H03M 5/20; H03M 13/05
USPC ............................ 375/240.24, 295, 300, 362
See application file for complete search history.

(56) References Cited

U.S. PATENT DOCUMENTS

| | | | |
|---|---|---|---|
| 6,373,903 B1 * | 4/2002 | Wynn | H04L 27/2075 375/283 |
| 8,233,477 B1 | 7/2012 | Goergen et al. | |
| 9,020,082 B2 | 4/2015 | Hidaka | |
| 9,197,326 B2 | 11/2015 | Anandarajah et al. | |
| 2003/0185251 A1 * | 10/2003 | Ichino | H04J 3/047 370/535 |
| 2003/0204806 A1 * | 10/2003 | Hisada | H04L 25/4908 714/758 |

(Continued)

OTHER PUBLICATIONS

Vujicic, Vidak, et al. "Mitigation of relative intensity noise of quantum dash mode-locked lasers for PAM4 based optical interconnects using encoding techniques." Optics Express 25.1 (2017): 20-29.

(Continued)

*Primary Examiner* — Emmanuel Bayard
(74) *Attorney, Agent, or Firm* — Active Knowledge Ltd.

(57) ABSTRACT

Encoding PAM4 or PAM8 symbols to have a power spectral density (PSD) similar to the PSD of a standard 8b10b Non-Return-to-Zero stream. In one embodiment, a transmitter includes first and second 8b10b encoders that receive first and second streams split from an original byte stream. The first and second 8b10b encoders output first and second 8b10b streams, respectively. The first and second 8b10b streams are fed into a 2-bit combiner that performs a linear combination of the first and second 8b10b streams. And a 4-level Pulse Amplitude Modulation encoder (PAM4 encoder) converts the linear combination of each two bits, received from the combiner, into a PAM4 symbol. Wherein the resulting stream of PAM4 symbols has PSD similar to the PSD of the standard 8b10b non-return-to-zero stream.

15 Claims, 4 Drawing Sheets

(56) References Cited

U.S. PATENT DOCUMENTS

| | | | | |
|---|---|---|---|---|
| 2007/0162807 A1* | 7/2007 | Kurayama | ....... | G01R 31/31813 714/738 |
| 2008/0170858 A1 | 7/2008 | Barry et al. | | |
| 2009/0315743 A1* | 12/2009 | Huang | ................ | H04L 25/4919 341/106 |
| 2011/0109484 A1* | 5/2011 | Sugita | ..................... | H03M 5/20 341/55 |
| 2013/0170579 A1* | 7/2013 | Nishioka | ............... | H04L 1/0057 375/295 |
| 2013/0181853 A1* | 7/2013 | Konishi | ............. | H04L 27/2071 341/76 |
| 2014/0300755 A1* | 10/2014 | Funamoto | ............. | H03M 5/145 348/187 |

OTHER PUBLICATIONS

International search report, PCT/IB2020/056614, dated Nov. 22, 2020.

Written opinion of the international searching authority, PCT/IB2020/056614, dated Nov. 22, 2020.

Pascual, M. D. G., Vujicic, V., Braddell, J., Smyth, F., Anandarajah, P., & Barry, L. (2017). Photonic integrated gain switched optical frequency comb for spectrally efficient optical transmission systems. IEEE Photonics Journal, 9(3), 1-8.

Dalwadi, D. C., Goradiya, B. C., Solanki, M. M., & Holia, M. S. (May 2011). Performance evaluation of Power Spectral Density of different line coding technique. In Proceedings of the National Conference on Recent Trends in Engineering & Technology, Anand, India (pp. 13-14).

Chaibi, M. E., Bramerie, L., Lobo, S., & Peucheret, C. (2017). Mitigation of mode partition noise in quantum-dash Fabry-Perot mode-locked lasers using Manchester encoding and balanced detection. Optics Express, 25(14), 16300-16309.

Vujicic, V., Anthur, A. P., Saljoghei, A., Panapakkam, V., Zhou, R., Gaimard, Q., . . . & Barry, L. P. (2017). Mitigation of relative intensity noise of quantum dash mode-locked lasers for PAM4 based optical interconnects using encoding techniques. Optics Express, 25(1), 20-29.

* cited by examiner

8B10B PAM4 ENCODING

CROSS-REFERENCE TO RELATED APPLICATIONS

This application claims priority to U.S. Provisional Patent Application No. 62/873,965, filed Jul. 14, 2019.

BACKGROUND

8b/10b (referred to as 8b10b) is a line code that maps 8-bit words to 10-bit symbols to achieve DC-balance and bounded disparity. Non-Return-to-Zero (NRZ) line code is a binary code in which ones are represented by a positive voltage, while zeros are represented by a negative voltage, with no neutral condition. 8b10b NRZ has a unique power spectral density (PSD) that is well known in the art.

SUMMARY

There is a need to preserve the 8b10b NRZ power spectral density (PSD), while transmitting in 4-level pulse-amplitude modulation (PAM4), in order to improve the transmission throughput while preserving compatibility with the 8b10b NRZ characteristics. However, standard PAM4 modulations have different power spectral densities than the standard 8b10b NRZ modulation.

Therefore, in one embodiment, two 8b10b-encoders are linearly combined to form PAM4 modulation having PSD that is essentially the same as the PSD of the standard 8b10b NRZ modulation, as follows. A transmitter includes first and second 8b10b encoders configured to receive first and second streams split from an original byte stream; the first and second 8b10b encoders are configured to output first and second 8b10b streams, respectively. A 2-bit combiner configured to perform a linear combination of the first and second 8b10b streams. And a 4-level Pulse Amplitude Modulation encoder (PAM4 encoder) configured to convert the linear combination of each two bits, received from the combiner, into a PAM4 symbol.

Optionally, the first and second 8b10b encoders are standard 8b10b encoders, each outputs a bit stream having half the rate of the original byte stream. Optionally, the PAM4 symbols preserve 8b10b non-return-to-zero line code transmission power spectral density, with essentially the same overhead, which is around 25% for the standard 8b10b. In one example, the implementation may be close to but not identical to the standard 8b10b NRZ, and then the overhead may be somewhat higher, such as up to 35% overhead. Optionally, the resulting stream of PAM4 symbols preserves the power spectral density (PSD) of a standard 8b10b non-return-to-zero stream, which enables band separation between downlink and uplink channels of a transceiver that includes the transmitter. Optionally, the band separation enables the transceiver to transmit over the uplink channel without having to implement echo cancellation in both the uplink and the downlink receivers. Optionally, the split from the original byte stream is performed such that odd bits of the original byte stream are forwarded to the first 8b10b encoder, and even bits of the original byte stream are forwarded to the second 8b10b encoder. Optionally, the split from the original byte stream is performed such that two consecutive bits of the original byte stream are forwarded to the first 8b10b encoder, the next two consecutive bits of the original byte stream are forwarded to the second 8b10b encoder, and continuing this way to toggle the original byte stream between the first and second 8b10b encoders. Optionally, four consecutive bits of the original byte stream are forwarded to the first 8b10b encoder, next four consecutive bits of the original byte stream are forwarded to the second 8b10b encoder, and continuing this way to toggle the original byte stream between the first and second 8b10b encoders. And optionally, the convert of the linear combination of each two bits comprises converting the pair (0,0) to 1, converting the pair (0,1) to ⅓, converting the pair (1,0) to −⅓, and converting the pair (1,1) to −1.

In another embodiment, a method includes: receiving, by first and second 8b10b encoders, first and second streams split from an original byte stream, and outputting first and second 8b10b streams, respectively; performing, by a 2-bit combiner, a linear combination of the first and second 8b10b streams; and converting the linear combination of each two bits, received from the combiner, into a PAM4 symbol.

Optionally, the resulting stream of PAM4 symbols preserves the power spectral density (PSD) of a standard 8b10b non-return-to-zero stream, which enables band separation between downlink and uplink channels of a transceiver that implements the method. Optionally, the split from the original byte stream is performed such that odd bits of the original byte stream are forwarded to the first 8b10b encoder, and even bits of the original byte stream are forwarded to the second 8b10b encoder. Optionally, the split from the original byte stream is performed such that two consecutive bits of the original byte stream are forwarded to the first 8b10b encoder, the next two consecutive bits of the original byte stream are forwarded to the second 8b10b encoder, and continuing this way to toggle the original byte stream between the first and second 8b10b encoders. Optionally, four consecutive bits of the original byte stream are forwarded to the first 8b10b encoder, next four consecutive bits of the original byte stream are forwarded to the second 8b10b encoder, and continuing this way to toggle the original byte stream between the first and second 8b10b encoders.

In still another embodiment, a transmitter includes first, second, and third 8b10b encoders configured to receive first, second and third streams split from an original byte stream. The first, second, and third 8b10b encoders are configured to output first, second, and third 8b10b streams, respectively. A 3-bit combiner configured to perform a linear combination of the first, second, and third 8b10b streams. And a PAM8 encoder is configured to convert the linear combination of each three bits, received from the 3-bit combiner, into a PAM8 symbol.

BRIEF DESCRIPTION OF THE DRAWINGS

The embodiments are herein described, by way of example only, with reference to the accompanying drawings. No attempt is made to show structural details of the embodiments in more detail than is necessary for a fundamental understanding of the embodiments. In the drawings.

DETAILED DESCRIPTION

Figure 1:
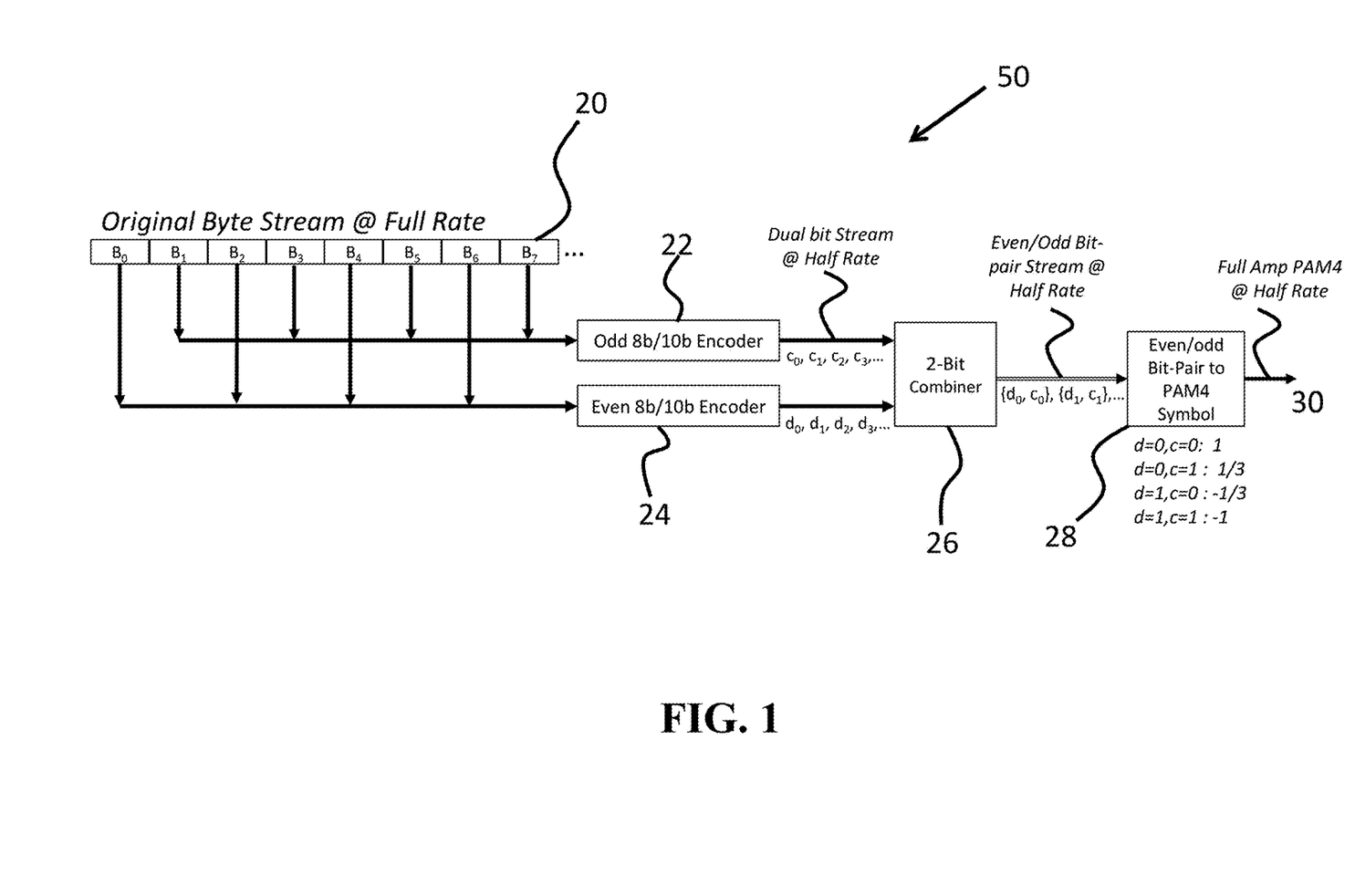
FIG. 1 illustrates one embodiment of system 50 that outputs PAM4 symbols that preserve the 8b10b NRZ line code transmission PSD.

FIG. 1 illustrates one embodiment of system 50 that outputs 4-level Pulse Amplitude Modulation (PAM4) symbols that preserve the 8b10b Non-Return-to-Zero (NRZ) line code transmission power spectral density (PSD), with a similar (e.g., 25%) overhead. The system 50 includes first and second 8b10b encoders (22, 24) that receive first and second bit streams split from an original byte stream 20. Splitting the original byte stream into the first and second bit streams may take various forms, as discussed below. The first and second 8b10b encoders output first and second 8b10b streams, respectively. The first and second 8b10b streams are fed into a 2-bit combiner 26 that performs a linear combination of the first and second 8b10b streams. The linear combination of each two corresponding bits is converted into a PAM4 symbol by a PAM4 encoder 28. Due to the linear combination of the first and second 8b10b streams by the combiner 26, the resulting stream of PAM4 symbols 30 has a PSD similar to the PSD of the standard 8b10b NRZ stream.

Splitting the original byte stream into the first and second streams may take various forms, such as (i) forwarding the odd bits of the original byte stream to the first 8b10b encoder, and forwarding the even bits of the original byte stream to the second 8b10b encoder, (ii) forwarding two consecutive bits of the original byte stream to the first 8b10b encoder, forwarding the next two consecutive bits of the original byte stream to the second 8b10b encoder, and continuing this way to toggle the original byte stream between the first and second 8b10b encoders, or (iii) forwarding four consecutive bits of the original byte stream to the first 8b10b encoder, forwarding the next four consecutive bits of the original byte stream to the second 8b10b encoder, and continuing this way to toggle the original byte stream between the first and second 8b10b encoders.

In one embodiment, the first and second 8b10b encoders (22, 24) are standard 8b10b encoders, each outputs a bit stream having half the rate of the original byte stream 20.

In one embodiment, the 2-bit combiner 26 performs a linear combination of the first and second 8b10b streams by generating bit-pairs from corresponding bits from the first and second 8b10b streams. The linear combination may place either the bit from the first 8b10b stream as the significant bit and the bit from the second 8b10b stream as the insignificant bit, or the bit from the first 8b10b stream as the insignificant bit and the bit from the second 8b10b stream as the significant bit.

The PAM4 encoder 28 maps each bit-pair to a PAM4 symbol, for example, by converting the pair (0,0) to 1, converting the pair (0,1) to ⅓, converting the pair (1,0) to −⅓, and converting the pair (1,1) to −1. The resulting stream of PAM4 symbols 30 has PSD similar to the PSD of the standard 8b10b NRZ stream, probably due to the linear combination of the 8b10b streams performed by the combiner 26. In one example, the resulting stream of PAM4 symbols has PSD with an overhead of 25% (that is similar to the overhead of the standard 8b10b NRZ stream).

In one embodiment, the system 50 does not use Gray code (also known as reflected binary code). Gray code is not a linear operation, and thus the PSD of PAM4 symbols generated by a similar system that does apply Gray code (optionally after the PAM4 encoder) should show suboptimal low frequency suppression compared to the PAM4 symbols 30 generated by system 50 that does not use Gray code.

Figure 2:
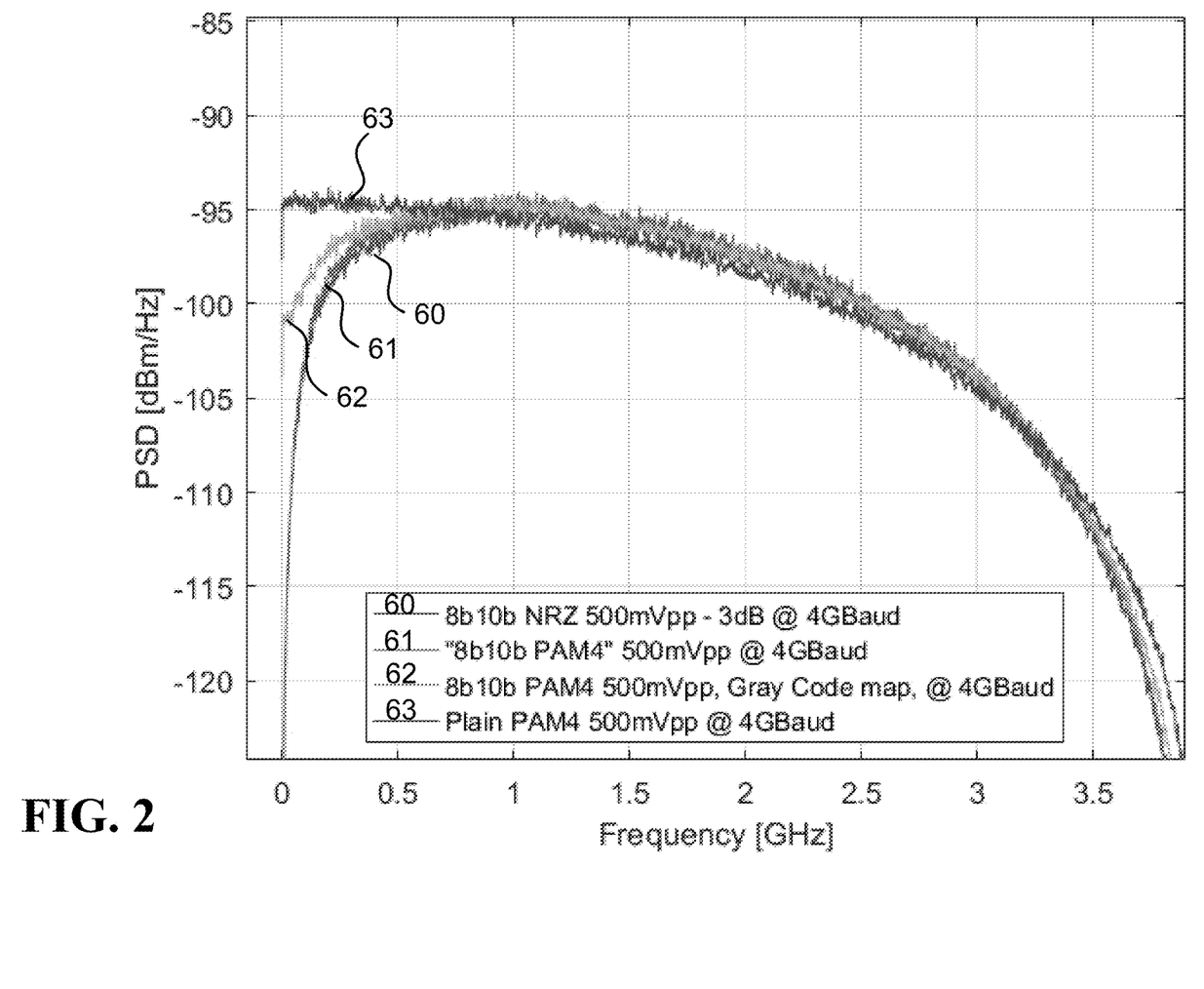
FIG. 2 illustrates a graph that compares the transmitted power spectral densities of various modulation schemes.

FIG. 2 illustrates a graph that compares the transmitted PSD of 8b10b NRZ (referred to as 8b10b NRZ 500 mVpp−3 dB; 60) with the transmitted PSD of the PAM4 symbols 30 generated by system 50 (referred to as "8b10b PAM4" 500 mVpp; 61), the transmitted PSD of 8b10b PAM4 500 mVpp with Gray code 62, and the transmitted PSD of a standard PAM4 500 mVpp 63.

As illustrated in FIG. 2, the PSD of "8b10b PAM4" with 500 mVpp 61 at 4 GBaud (8 Gbps) approximates very well the low frequency suppression of the PAM4 symbols 30 generated by system 50 (8b10b NRZ; 60) at 4 GBaud (4 Gbps) with similar max PSD. Since PAM4 has 2.55 dB lower RMS than NRZ, half rate PAM4 at full AMP generates similar transmitted PSD as half rate NRZ at Full Amp −3 dB.

Still referring to FIG. 2, the PSD of 8b10b PAM4 500 mVpp with Gray code 62 at 4 GBaud shows sub-optimal suppression (band separation) relative to the PSD of 8b10b NRZ 60. The PSD of plain PAM4 500 mVpp 63 is even worse than the PSD of 8b10b PAM4 with Gray code 62 when compared to the PSD of 8b10b NRZ 60.

In one embodiment, preserving the 8b10b NRZ PSD in PAM4 transmissions keeps the low frequencies energy suppressed, which enables band separation between the downlink and uplink channels. This band separation enables the transceivers to transmit over the uplink channel, in these low frequencies in low bit rate, without having to implement echo cancellation in both the uplink and the downlink receivers.

In another embodiment, the 8b10b coding concentrates its energy between Nyquist and Nyquist/10 frequencies, and therefore it is easy to equalize such signal at the receiver using low power low complexity analog equalizer. As a result, 8b10b is very popular in many PAM2 solutions. By maintaining the 8b10b NRZ PSD in PAM4, one embodiment of the system retains all the benefits of 8b10b NRZ, and as a result allows easy upgrade path to existing 8b10b PAM2 solutions that want to add a higher bit rate mode over existing PAM2 solutions. For example, a PAM2 embodiment that transmits up to 4 Gbps can be upgraded to transmit up to 8 Gbps with the same symbol rate but at PAM4 with essentially the same receiver.

Figure 3:
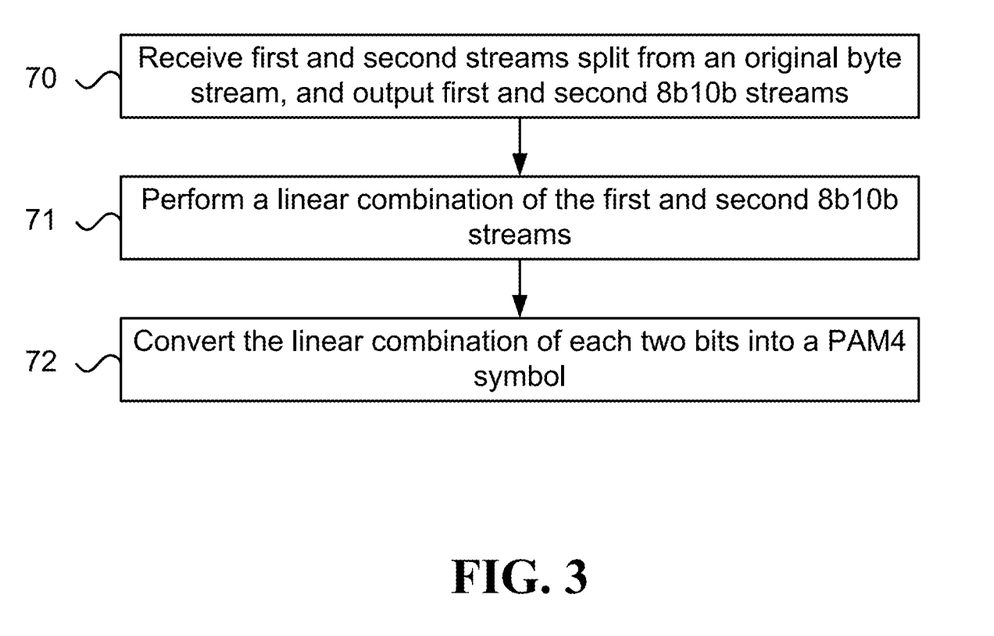
FIG. 3 illustrates one embodiment of a method that outputs PAM4 symbols that preserve the 8b10b NRZ line code transmission PSD.

FIG. 3 illustrates one embodiment of a method that outputs PAM4 symbols that preserve the 8b10b NRZ line code transmission PSD. The method includes the following steps. In step 70, receiving, by first and second 8b10b encoders, first and second streams split from an original byte stream, and outputting first and second 8b10b streams, respectively. In step 71, performing, by a 2-bit combiner, a linear combination of the first and second 8b10b streams. And in step 72, converting the linear combination of each two bits, received from the combiner, into a PAM4 symbol.

Still referring to the method, optionally, the resulting stream of the PAM4 symbols preserves the PSD of a standard 8b10b non-return-to-zero stream, which enables band separation between downlink and uplink channels of a transceiver that implements the method. Optionally, the split from the original byte stream is performed such that odd bits of the original byte stream are forwarded to the first 8b10b encoder, and even bits of the original byte stream are forwarded to the second 8b10b encoder. Optionally, the split from the original byte stream is performed such that two consecutive bits of the original byte stream are forwarded to the first 8b10b encoder, the next two consecutive bits of the original byte stream are forwarded to the second 8b10b encoder, and continuing this way to toggle the original byte stream between the first and second 8b10b encoders. And optionally, four consecutive bits of the original byte stream are forwarded to the first 8b10b encoder, next four consecutive bits of the original byte stream are forwarded to the second 8b10b encoder, and continuing this way to toggle the original byte stream between the first and second 8b10b encoders.

In another embodiment, a system outputs 8-level Pulse Amplitude Modulation (PAM8) symbols that preserve the 8b10b NRZ line code transmission power spectral density (PSD), with a similar overhead. The system includes three 8b10b encoders that receive three streams split from an original byte stream. Splitting the original byte stream into the three bit streams may take various forms, in a similar manner to the above provided explanation. The three 8b10b encoders output three 8b10b streams, respectively. The three 8b10b streams are fed into a 3-bit combiner that performs a linear combination of the three 8b10b streams. The linear combination of each three corresponding bits is converted into a PAM8 symbol by a PAM8 encoder. Due to the linear combination of the three 8b10b streams by the combiner, the resulting stream of PAM8 symbols has a PSD similar to the PSD of the standard 8b10b NRZ stream. In a similar manner it is possible to generate higher order PAM modulations (such as PAM16) by adding additional 8b10b encoders and using a suitable PAM encoder.

The elements used by the embodiments may be implemented in various ways, such as using a processor. A "processor" may refer to one or more of the following components: a general-purpose processing device, a microprocessor, a central processing unit, a complex instruction set computing (CISC) microprocessor, a reduced instruction set computing (RISC) microprocessor, an application specific integrated circuit (ASIC), a field programmable gate array (FPGA), a digital signal processor (DSP), and/or a network processor.

Elements, such as modules utilized by the systems described herein, may be implemented utilizing a combination that includes one or more of the following hardware, firmware, and software elements: ASIC, FPGA, processors, memory blocks, discrete circuits, integrated circuits, at least one processor to execute commands stored in at least one memory block, a non-transitory computer-readable medium comprising computer-executable instructions that when executed on a computing device cause the computing device to perform certain operations, a processor and a computer readable storage medium comprising a program of instructions executable by the processor wherein when the instructions are executed the processor perform certain operations, a computer system comprising one or more processing units and memory storing one or more programs configured for execution by the one or more processors units wherein the one or more programs include instructions for certain operations, a system comprising a data processing apparatus and a non-transitory computer readable medium storing instructions executable by the data processing apparatus and that upon such execution cause the data processing apparatus to perform certain operations. Buffers may be implemented using memory to store the data, and processor to access the data over a communication channel, such as a parallel bus or a serial bus.

Figure 4:
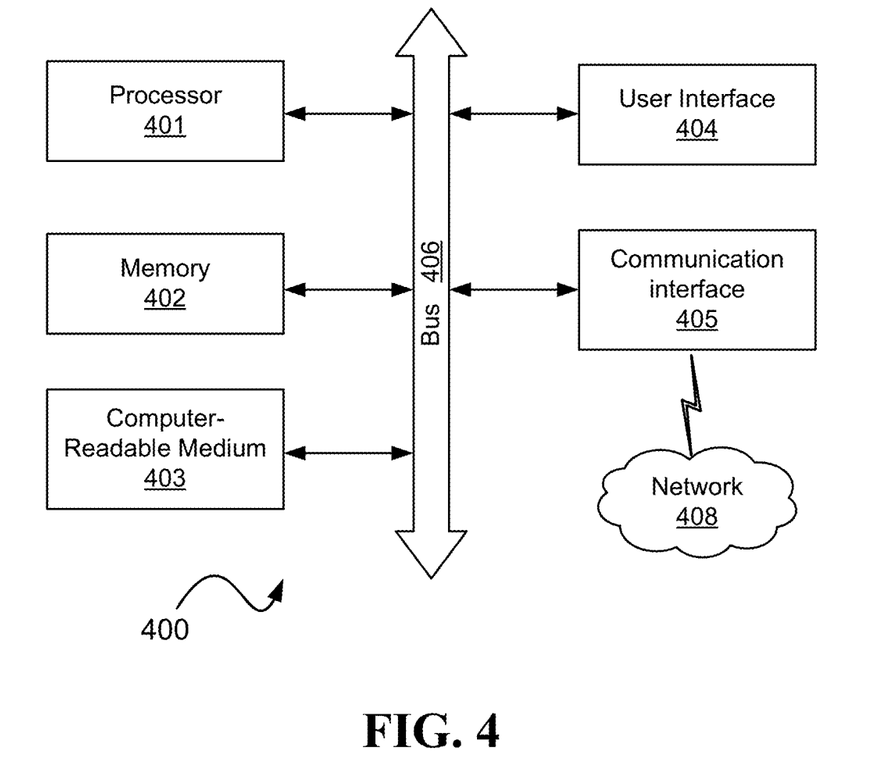
FIG. 4 and FIG. 5 are schematic illustrations of possible embodiments for computers.
Figure 5:
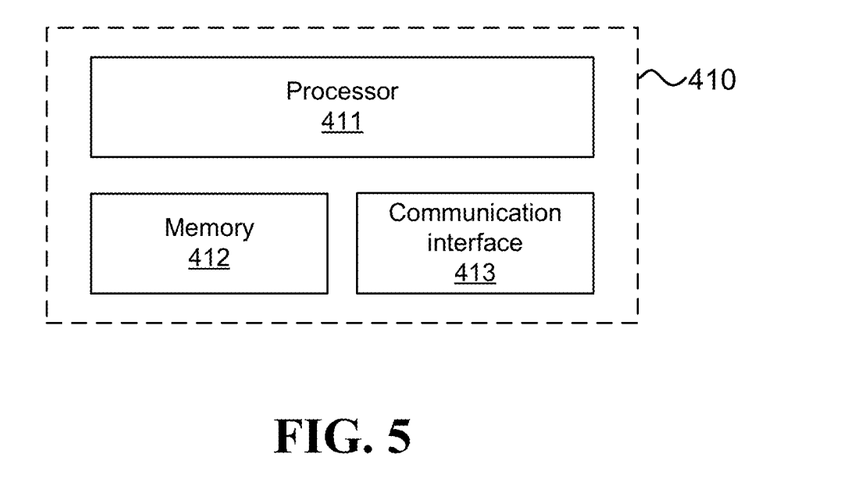

FIG. 4 and FIG. 5 are schematic illustrations of possible additional or alternative embodiments for computers (400, 410) that are able to realize one or more of the embodiments discussed herein that include a "computer". The computer (400, 410) may be implemented in various ways, such as, but not limited to, a microcontroller, a computer on a chip, a system-on-chip (SoC), a system-on-module (SoM), a processor with its required peripherals, a server computer, a client computer, a personal computer, a cloud computer, a network device, a communication device, a handheld device, a wearable device, and/or any other computer form capable of executing a set of computer instructions. Further, references to a computer or a processor include any collection of one or more computers and/or processors (which may be at different locations) that individually or jointly execute one or more sets of computer instructions. This means that the singular term "computer" is intended to imply one or more computers, which jointly perform the functions attributed to "the computer".

The computer 400 includes one or more of the following components: processor 401, memory 402, computer readable medium 403, user interface 404, communication interface 405, and bus 406. The computer 410 includes one or more of the following components: processor 411, memory 412, and communication interface 413.

Functionality of various embodiments may be implemented in hardware, software, firmware, or any combination thereof. If implemented at least in part in software, implementing the functionality may involve a computer program that includes one or more instructions or code stored or transmitted on a computer-readable medium and executed by one or more processors. Computer-readable media may include computer-readable storage media, which corresponds to a tangible medium such as data storage media, or communication media including any medium that facilitates transfer of a computer program from one place to another. Computer-readable medium may be any media that can be accessed by one or more computers to retrieve instructions, code, data, and/or data structures for implementation of the described embodiments. A computer program product may include a computer-readable medium. In one example, the computer-readable medium 403 may include one or more of the following: RAM, ROM, EEPROM, optical storage, magnetic storage, biologic storage, flash memory, or any other medium that can store computer readable data.

A computer program (also known as a program, software, software application, script, program code, or code) can be written in any form of programming language, including compiled or interpreted languages, declarative or procedural languages. The program can be deployed in any form, including as a standalone program or as a module, component, subroutine, object, or another unit suitable for use in a computing environment. A computer program may correspond to a file in a file system, may be stored in a portion of a file that holds other programs or data, and/or may be stored in one or more files that may be dedicated to the program. A computer program may be deployed to be executed on one or more computers that are located at one or more sites that may be interconnected by a communication network.

Computer-readable medium may include a single medium and/or multiple media that store one or more sets of instructions. In various embodiments, a computer program, and/or portions of a computer program, may be stored on a non-transitory computer-readable medium, and may be updated and/or downloaded via a communication network, such as the Internet. At least some of the methods described herein are "computer-implemented methods" that are implemented on a computer, such as the computer (400, 410), by executing instructions on the processor (401, 411). Additionally, at least some of these instructions may be stored on a non-transitory computer-readable medium.

While the methods disclosed herein have been described and shown with reference to particular steps performed in a particular order, it is understood that these steps may be combined, sub-divided, and/or reordered to form an equivalent method without departing from the teachings of the embodiments. Accordingly, unless specifically indicated herein, the order and grouping of the steps is not a limitation of the embodiments. Furthermore, methods and mechanisms of the embodiments will sometimes be described in singular form for clarity. However, some embodiments may include multiple iterations of a method or multiple instantiations of a mechanism unless noted otherwise. For example, when a processor is disclosed in one embodiment, the scope of the embodiment is intended to also cover the use of multiple processors. Certain features of the embodiments, which may have been, for clarity, described in the context of separate embodiments, may also be provided in various combinations in a single embodiment. Conversely, various features of the embodiments, which may have been, for brevity, described in the context of a single embodiment, may also be provided separately or in any suitable sub-combination. Embodiments described in conjunction with specific examples are presented by way of example, and not limitation.

Herein, references to "one embodiment" mean that the feature being referred to may be included in at least one embodiment of the invention. Moreover, separate references to "one embodiment" or "some embodiments" in this description do not necessarily refer to the same embodiment. Additionally, references to "one embodiment" and "another embodiment" may not necessarily refer to different embodiments, but may be terms used, at times, to illustrate different aspects of an embodiment.

The embodiments may include any variety of combinations and/or integrations of the features of the embodiments described herein. Although some embodiments may depict serial operations, the embodiments may perform certain operations in parallel and/or in different orders from those depicted. Moreover, the use of repeated reference numerals and/or letters in the text and/or drawings is for the purpose of simplicity and clarity and does not in itself dictate a relationship between the various embodiments and/or configurations discussed. The embodiments are not limited in their applications to the details of the order or sequence of steps of operation of methods, or to details of implementation of devices, set in the description, drawings, or examples. Moreover, individual blocks illustrated in the figures may be functional in nature and therefore may not necessarily correspond to discrete hardware elements.

It is evident that many alternatives, modifications, and variations will be apparent to those skilled in the art. It is to be understood that other embodiments may be utilized and structural changes may be made without departing from the scope of the embodiments.

What is claimed is:

1. A transmitter comprising;
   first and second 8b10b encoders configured to receive first and second streams split from an original byte stream; the first and second 8b10b encoders are configured to output first and second 8b10b streams, respectively;
   a 2-bit combiner configured to perform a linear combination of the first and second 8b10b streams; and
   a 4-level Pulse Amplitude Modulation encoder (PAM4 encoder) configured to convert the linear combination of each two bits, received from the combiner, into a PAM4 symbol.

2. The transmitter of claim 1, wherein the first and second 8b10b encoders are standard 8b10b encoders, each outputs a bit stream having half the rate of the original byte stream.

3. The transmitter of claim 1, wherein the PAM4 symbols preserve 8b10b non-return-to-zero line code transmission power spectral density with an overhead of about 25%.

4. The transmitter of claim 1, wherein the resulting stream of PAM4 symbols preserves the power spectral density (PSD) of a standard 8b10b non-return-to-zero stream, which enables band separation between downlink and uplink channels of a transceiver that includes the transmitter.

5. The transmitter of claim 4, wherein the band separation enables the transceiver to transmit over the uplink channel without having to implement echo cancellation in both the uplink and the downlink receivers.

6. The transmitter of claim 1, wherein the split from the original byte stream is performed such that odd bits of the original byte stream are forwarded to the first 8b10b encoder, and even bits of the original byte stream are forwarded to the second 8b10b encoder.

7. The transmitter of claim 1, wherein the split from the original byte stream is performed such that two consecutive bits of the original byte stream are forwarded to the first 8b10b encoder, the next two consecutive bits of the original byte stream are forwarded to the second 8b10b encoder, and continuing this way to toggle the original byte stream between the first and second 8b10b encoders.

8. The transmitter of claim 1, wherein four consecutive bits of the original byte stream are forwarded to the first 8b10b encoder, next four consecutive bits of the original byte stream are forwarded to the second 8b10b encoder, and continuing this way to toggle the original byte stream between the first and second 8b10b encoders.

9. The transmitter of claim 1, wherein the convert of the linear combination of each two bits comprises converting the pair (0,0) to 1, converting the pair (0,1) to $1/3$, converting the pair (1,0) to $-1/3$, and converting the pair (1,1) to $-1$.

10. A method comprising;
    receiving, by first and second 8b10b encoders, first and second streams split from an original byte stream, and outputting first and second 8b10b streams, respectively;
    performing, by a 2-bit combiner, a linear combination of the first and second 8b10b streams; and
    converting the linear combination of each two bits, received from the combiner, into a PAM4 symbol.

11. The method of claim 10, wherein the resulting stream of PAM4 symbols preserves the power spectral density (PSD) of a standard 8b10b non-return-to-zero stream, which enables band separation between downlink and uplink channels of a transceiver that implements the method.

12. The method of claim 10, wherein the split from the original byte stream is performed such that odd bits of the original byte stream are forwarded to the first 8b10b encoder, and even bits of the original byte stream are forwarded to the second 8b10b encoder.

13. The method of claim 10, wherein the split from the original byte stream is performed such that two consecutive bits of the original byte stream are forwarded to the first 8b10b encoder, the next two consecutive bits of the original byte stream are forwarded to the second 8b10b encoder, and continuing this way to toggle the original byte stream between the first and second 8b10b encoders.

14. The method of claim 10, wherein four consecutive bits of the original byte stream are forwarded to the first 8b10b encoder, next four consecutive bits of the original byte stream are forwarded to the second 8b10b encoder, and continuing this way to toggle the original byte stream between the first and second 8b10b encoders.

15. A transmitter comprising;
    first, second, and third 8b10b encoders configured to receive first, second and third streams split from an original byte stream; the first, second, and third 8b10b encoders are configured to output first, second, and third 8b10b streams, respectively;

a 3-bit combiner configured to perform a linear combination of the first, second, and third 8b10b streams; and a 8-level Pulse Amplitude Modulation encoder (PAM8 encoder) configured to convert the linear combination of each three bits, received from the 3-bit combiner, into a PAM8 symbol.

\* \* \* \* \*